United States Patent
An et al.

(10) Patent No.: US 11,870,451 B1
(45) Date of Patent: Jan. 9, 2024

(54) FREQUENCY SYNTHESIZER USING VOLTAGE-CONTROLLED OSCILLATOR (VCO) CORE OF WIDEBAND SYNTHESIZER WITH INTEGRATED VCO

(71) Applicant: VIAVI SOLUTIONS INC., Chandler, AZ (US)

(72) Inventors: Byung-Kuk An, Seoul (KR); Young-Joung Hong, Seoul (KR); Hyoung-Kyoun Park, Seoul (KR)

(73) Assignee: VIAVI SOLUTIONS INC., Chandler, AZ (US)

( * ) Notice: Subject to any disclaimer, the term of this patent is extended or adjusted under 35 U.S.C. 154(b) by 0 days.

(21) Appl. No.: 18/084,805

(22) Filed: Dec. 20, 2022

(51) Int. Cl.
*H03L 7/187* (2006.01)
*H03L 7/099* (2006.01)
*H03L 7/093* (2006.01)

(52) U.S. Cl.
CPC ............. *H03L 7/187* (2013.01); *H03L 7/093* (2013.01); *H03L 7/099* (2013.01)

(58) Field of Classification Search
CPC .......... H03L 7/187; H03L 7/093; H03L 7/099
See application file for complete search history.

(56) References Cited

U.S. PATENT DOCUMENTS

| | | | | |
|---|---|---|---|---|
| 6,249,559 B1 * | 6/2001 | Jun | ............................. | H03C 1/60 375/376 |
| 8,674,771 B2 * | 3/2014 | Darabi | ...................... | H03L 7/099 331/34 |
| RE45,557 E * | 6/2015 | Caresosa | ................... | H04L 7/033 |
| 9,954,541 B1 * | 4/2018 | Goyal | ......................... | H03B 5/32 |
| 11,012,079 B1 * | 5/2021 | Cali | ............................ | H03L 7/099 |
| 11,095,293 B1 * | 8/2021 | Sahu | ........................ | H03L 7/1976 |
| 11,626,882 B1 * | 4/2023 | An | ............................. | H03L 7/093 327/16 |
| 2003/0171105 A1 * | 9/2003 | Dunworth | ................ | H03L 7/099 455/318 |
| 2003/0171106 A1 * | 9/2003 | Dunworth | ................ | H03L 7/099 455/260 |
| 2008/0231333 A1 * | 9/2008 | Huang | ........................ | H03L 7/16 327/158 |
| 2008/0232522 A1 * | 9/2008 | Rofougaran | ........... | H03G 3/3078 375/355 |

(Continued)

FOREIGN PATENT DOCUMENTS

KR        102437666 B1 *     8/2022

OTHER PUBLICATIONS

"LMX2595 20-GHz Wideband Pllatinum™ RF Synthsizer With Phase Synchronization and JESD204B Support" publisher Texas Instruments, date Apr. 2019, pp. 80.

*Primary Examiner* — Adam D Houston
(74) *Attorney, Agent, or Firm* — Mannava & Kang, P.C.

(57) ABSTRACT

A frequency synthesizer employs a combination of a low divide ratio divider phase-locked loop (PLL) and a wide band, on-chip voltage-controlled oscillator (VCO). To reduce phase noise, low divide ratio phase detection is employed. By using the off-chip PLL with a bank of on-chip VCOs, the frequency synthesizer may have enhanced frequency stability and avoid having to include an acquisition circuit. A separation between the PLL and VCO may reduce integer boundary spurs (IBS) eliminating or reducing a need for a filter bank and switches reducing a complexity of the frequency synthesizer.

20 Claims, 10 Drawing Sheets

(56) References Cited

U.S. PATENT DOCUMENTS

| | | | |
|---|---|---|---|
| 2009/0195336 A1* | 8/2009 | Huang | H03L 7/099 331/49 |
| 2009/0256960 A1* | 10/2009 | Chen | H04N 5/10 348/E5.009 |
| 2010/0141347 A1* | 6/2010 | Hsiao | H03L 7/113 331/17 |
| 2012/0268177 A1* | 10/2012 | Hogeboom | H03L 7/23 327/156 |
| 2013/0181756 A1* | 7/2013 | Ballantyne | H03L 7/0891 327/156 |
| 2016/0036485 A1* | 2/2016 | Nagaso | H04B 1/403 455/76 |
| 2017/0063383 A1* | 3/2017 | Yang | H03L 7/099 |
| 2017/0272056 A1* | 9/2017 | Lin | H03J 3/00 |

\* cited by examiner

FREQUENCY SYNTHESIZER USING VOLTAGE-CONTROLLED OSCILLATOR (VCO) CORE OF WIDEBAND SYNTHESIZER WITH INTEGRATED VCO

TECHNICAL FIELD

This patent application is directed to frequency synthesizers, and more specifically, to a radio frequency (RF) frequency synthesizer, where a low divide ratio phase-locked loop (PLL) circuit may be used to replace an internal PLL of a single integrated circuit (IC) frequency synthesizer.

BACKGROUND

A frequency synthesizer allows generation of a variety of output frequencies as multiples of a single reference frequency. A common application for a frequency synthesizer is in generating local oscillator (LO) signals for the up and down conversion of radio frequency (RF) signals. In an up-convert mode, the frequency synthesizer converts a lower frequency to a higher frequency, and it converts a higher frequency to a lower one in a downconvert mode. Frequency synthesizers are typically used in a receiver front-end or in a transmitter signal path to generate the RF signal for subsequent amplification.

Some of the common implementations of frequency synthesizers such as radio receivers, televisions, mobile telephones, radiotelephones, spectrum analyzers, cable television converter boxes, satellite receivers, and GPS systems, may involve processing of a wide band of RF signals. Thus, wide band frequency synthesizers may be used in such implementations. Wide band frequency synthesizers may have a number of challenges including, but not limited to, noise levels, engineering and financial cost of implementing circuitry (e.g., several filter banks, narrow voltage-controlled oscillators (VCOs), etc.).

BRIEF DESCRIPTION OF DRAWINGS

Features of the present disclosure are illustrated by way of example and not limited in the following Figure(s), in which like numerals indicate like elements, in which.

DETAILED DESCRIPTION

Figure 1:
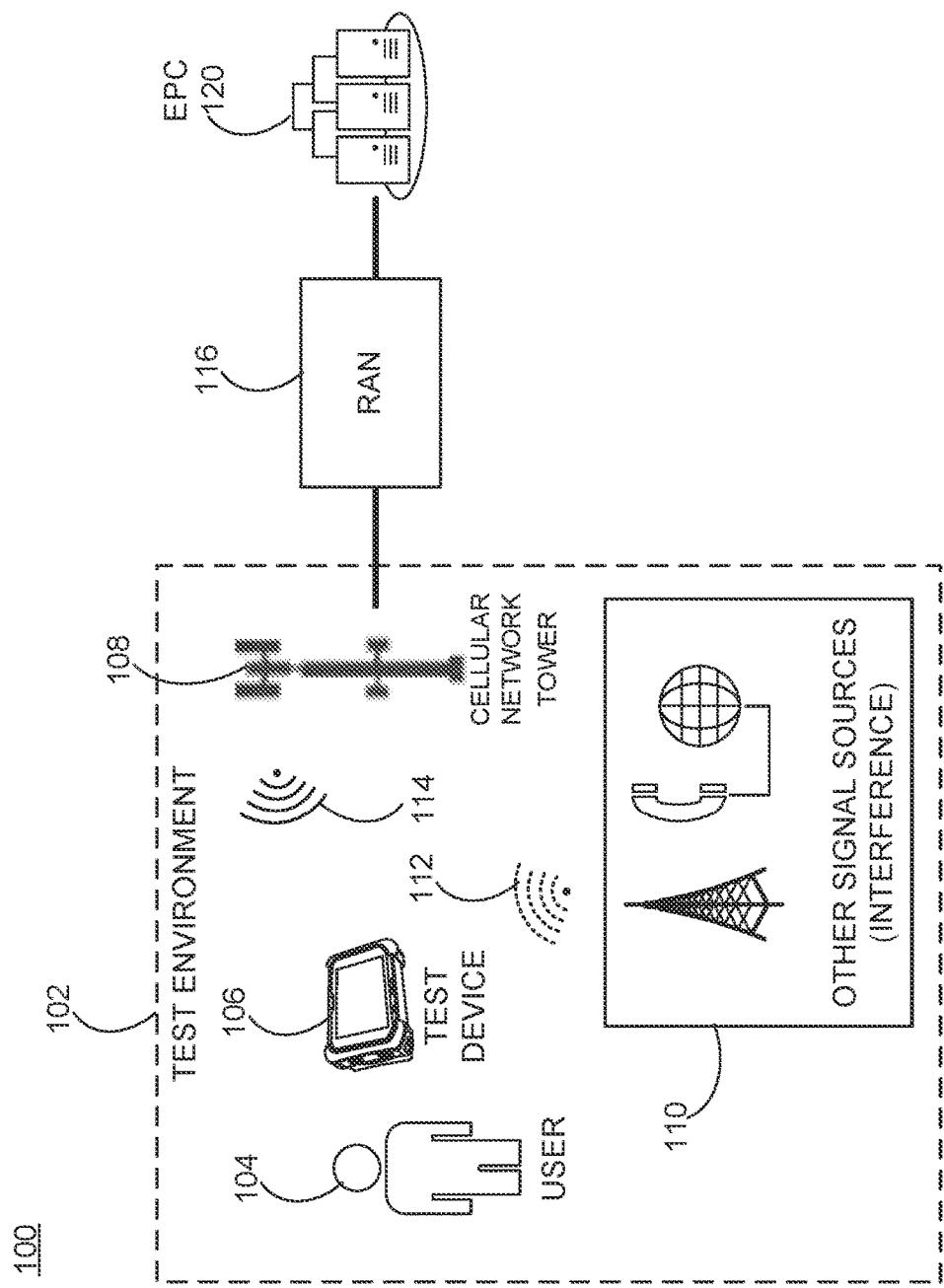
FIG. 1 illustrates a diagram of a test device in a test environment, according to an example.

For simplicity and illustrative purposes, the present disclosure is described by referring mainly to examples and embodiments thereof. In the following description, numerous specific details are set forth in order to provide a thorough understanding of the present disclosure. It will be readily apparent, however, that the present disclosure may be practiced without limitation to these specific details. In other instances, some methods and structures readily understood by one of ordinary skill in the art have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

As mentioned herein, a frequency synthesizer is used to generate a variety of output frequencies as multiples of a single reference frequency in applications such as up and down conversion of RF signals. Main types of frequency synthesizers may include direct analog synthesizers (DASs), direct digital synthesizers (DDSs), and phase locked loop (PLL) based synthesizers including integer-N and fractional-N PLLs. Wide band frequency synthesizers, which may be used in wide band applications such as spectrum analyzers and similar high frequency test, monitoring, and generation systems may have challenges such as noise levels, complex (and large numbers of) circuitry (e.g., several filter banks, narrow voltage-controlled oscillators (VCOs), etc.), and/or stable frequency locking over various operating temperature ranges.

In some examples of the present disclosure, a frequency synthesizer with a low divide ratio PLL and a wide band VCO is described. A low divide ratio PLL may use a multiplied version of a reference signal to reduce a divide ratio in mixing the reference signal and a feedback signal from the VCO, and thereby a phase noise. For example, a low divide ratio PLL may use a divider with a divide ratio of 2 to 10, whereas a conventional PLL may have a divide ratio of 100 or more. A wide band frequency synthesizer may operate with frequencies in high RF range, for example, multiple GHz compared to narrow band devices, which may be limited to frequency ranges from a few kHz to a few MHz. The PLL and the VCO may be implemented on separate chips (integrated circuits) or the PLL may be implemented as discrete circuits ("off-chip") on a printed circuit board (PCB) with the VCO on a chip on the same PCB to provide enhanced isolation between the PLL and the VCO. A passive or an active loop filter may be used.

Some advantages and benefits of the systems and methods described herein are readily apparent. For example, the systems and methods using one or more of the configurations described herein may allow for a wide band frequency synthesizer with low phase noise. By using a multiplied version of the input frequency for comparison with the VCO frequency at the PLL, a divide ratio of the frequency divider in the PLL may be substantially reduced (e.g., from 100 to 2). The lower divide ratio may result in substantially lower phase noise. Moreover, by replacing an on-chip PLL of an IC that includes a bank of VCOs with the low divide ratio, off-chip PLL, overall circuitry size and complexity may be reduced. Filter banks, switches, and/or an acquisition circuit may be avoided. By using the off-chip PLL, isolation between the PLL and the VCOs may be increased reducing IBS. Other benefits and advantages may also be apparent.

FIG. 1 illustrates a diagram 100 of a test device 106 in a test environment 102, according to an example. As shown in the diagram 100, a user 104 (e.g., technician) may use a test device 106 to test and analyze signals 114 from a cellular network tower 108, as well as other signals 112, which may come from other signal sources 110 such as a radio tower, telecom signals, and others, which may interfere with the signals 114 from the cellular network tower 108. The cellular network tower 108 may be part of a cell site and connected to backhaul via a radio access network (RAN) 116 and the backhaul may connect to Evolved Packet Core (EPC) 120.

A connection between the cellular network tower 108 and the rest of the world may be referred to as a backhaul link or simply backhaul. A backhaul may include wired, fiber optic and wireless components, such as microwave transmission equipment. In conventional 3G and 4G architectures, fronthaul is associated with a RAN 116 architecture including centralized base band units (BBUs), i.e., baseband controllers, and standalone remote radio heads (RRHs) installed at remote cell sites. These BBU and RRH functional blocks, as well as the equipment that performs these functions, are located further away from each other than in prior mobile backhaul models. In some instances, the RRH and BBU are at the same location. In other instances, the RRH is located at the cell site, whereas the BBU is located in a centralized and protected location where it serves multiple RRHs. The optical links that interconnect the BBU and the multiple RRHs are referred to as fronthaul. The fronthaul includes interfaces between the RRH and the BBU. The backhaul includes interfaces between the BBU and the EPC 120.

In an example, the test environment 102 may include the cell site, which includes the cellular network tower 108 or cellular base station having antennas and electronic communications equipment to support cellular mobile device communication. The antennas and equipment are typically placed in connection with a radio mast or tower, and the equipment generally connects cell site air interfaces to wireline networks, which may be include fiber optic cables and coaxial cables. Typically, the cell site may be connected to backhaul via the RAN 116 and the backhaul may connect to the EPC 120.

The RAN is the part of a mobile network that connects end-user devices, like smartphones, to the cloud. This is achieved by sending information via radio waves from end-user devices to a RAN's transceivers, and finally from the transceivers to the core network which connects to the global internet. Diagram 100 shows the test device 106 performing signal analysis. In an example, the user 104, such as a cellular service provider technician, may use the test device 106 to perform signal analysis for discovered carrier frequency and technology as well as discovered channels of selected technologies. Furthermore, interference hunting and beam centric electromagnetic field (EMF) testing on a selected carrier may be performed with the test device 106. In an example use case, the testing may be performed when the cell site is being installed, such as to ensure proper operation of the cell site with user devices, such as smartphones or other end user cellular devices. In another example use case, after installation, customers of the cellular service provider may be having technical issues, and the user 104 may use the test device 106 to check for signal interference from the other signal sources 110 or other potential causes of the technical issues so the technical issues can be resolved.

As discussed above, the test device 106 may be operable to perform an analysis on selected channels (by the user 104 or automatically). Carrier frequencies of available channels for one or more technologies may also be detected automatically or by the user 104. The carrier frequencies may be a center frequency and/or a synchronization signal block (SSB) frequency depending on the technology. The technologies may include, but are not limited to, 4G LTE, 5G NR, and DSS. Additional examples of the technologies may include long-term evolution-frequency division duplex (LTE-FDD), long-term evolution-time division duplex (LTE-TDD), new radio (NR), dynamic spectrum sharing-frequency division duplex (DSS-FDD), dynamic spectrum sharing-time division duplex (DSS-TDD).

In an example, the analysis of signals that can be performed by the test device 106 includes signal and spectrum analysis of received RF signals. The spectrum analysis may include a real-time display of signal level, such as dB, and frequency for the signals in a particular channel. The signal analysis can display information, including carrier frequency for the LTE and NR technologies of the channel, physical cell ID (PCI), channel power, Received Signal Strength Indicator (RSSI), Reference Signal Received Power (RSRP), Reference Signal Received Quality (RSRQ), Signal to Interference plus Noise Ratio (SINR), and antenna and other 3GPP specified parameters.

Accurate testing and analysis of network signals and any interfering signals may improve overall performance of a communications network. However, supporting high performance functions with various bandwidths, especially at and above 6 GHz, may be a challenge for spectrum analyzers. While analysis of various signals involves a number of components and their respective performance characteristics in the test device 106, frequency synthesizer performance may be a substantial contributor to accurate analysis or lack thereof. In some examples, a frequency synthesizer with a bank of on-chip VCOs and a low divide ratio, off-chip PLL may allow enhanced phase noise performance, reduced IBS, and wide band measurement with enhanced frequency stability.

Figure 2:
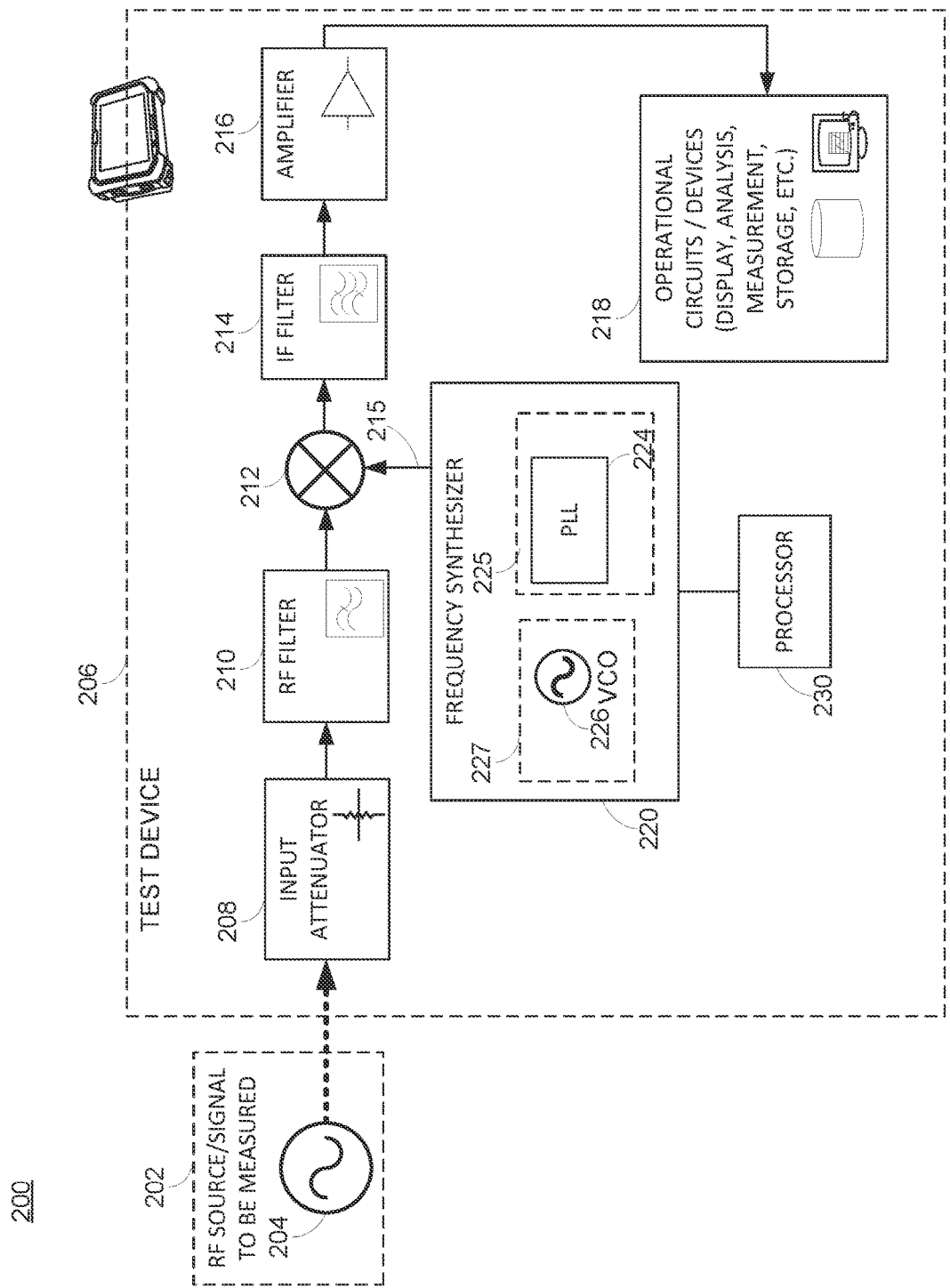
FIG. 2 illustrates a diagram of major components of a test device with a frequency synthesizer including an off-chip PLL and a bank of on-chip VCOs, according to an example.

FIG. 2 illustrates a diagram 200 of major components of a test device with a frequency synthesizer including an off-chip PLL and a bank of on-chip VCOs, according to an example. As diagram 200 shows, test device 206 may include an input attenuator 208, an RF filter 210, a mixer 212, a frequency synthesizer 220, an intermediate frequency (IF) filter 214, an amplifier 216, and operational circuits or devices 218. The frequency synthesizer 220 may include a VCO 226 and a PLL 224, among other circuits and subsystems. In an operation, the input attenuator 208 may receive an RF signal 204 to be measured from an RF source 202. The RF signal 204 may be attenuated at the input attenuator 208 and then filtered at the RF filter 210. The filtered RF signal may then be downconverted at the mixer 212 by mixing with a signal 215 from the frequency synthesizer 220. The resulting IF signal may be filtered at the IF filter 214 and amplified at the amplifier 216 for further processing by the operational circuits or devices 218. In some implementations, the PLL 224 and its associated circuitry may be on a chip 225 (integrated circuit "IC") while the VCO 226 and its associated circuitry may be on another chip 227.

In some examples, the operational circuits or devices 218 may display, analyze, measure, store, and perform comparable operations on the signal received from the amplifier 216. In some examples, the signal provided by the amplifier 216 may be converted to a digital signal. Thus, at least a portion of the operational circuits or devices 118 may be digital circuits or devices.

It should be appreciated that FIG. 2 shows a simplified block diagram of major components of the test device 206. A test device or similar measurement system may be implemented with additional of fewer components, where certain functionality may be distributed among various components and sub-systems or performed by additional components or sub-systems. Furthermore, the test device 206 may be any RF measurement system/device including, but not limited to, a spectrum analyzer, a cellular system monitoring device, an RF power analyzer, etc. Example frequency synthesizers described herein may also be implemented in other systems and devices such as radio receivers, televisions, mobile telephones, radiotelephones, cable television converter boxes, satellite receivers, and GPS systems using the principles described herein.

Figure 3:
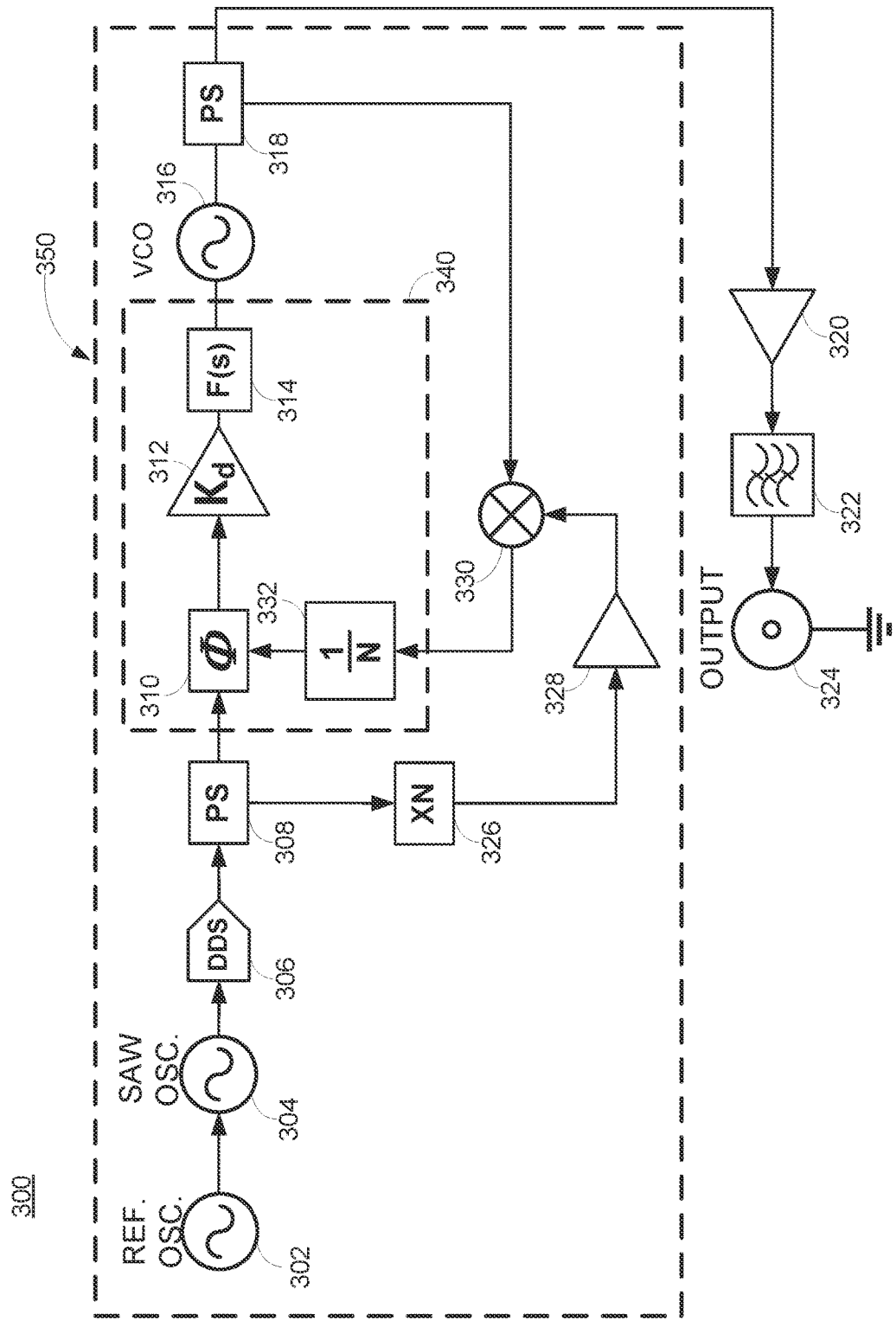
FIG. 3 illustrates a schematic diagram of a frequency synthesizer including a PLL and a wide band VCO, according to an example.

FIG. 3 illustrates a schematic diagram 300 of a frequency synthesizer 350 including a PLL and a wide band VCO, according to an example. The frequency synthesizer 350 shown in FIG. 3 may be used as the frequency synthesizer 220 shown in FIG. 2. Diagram 300 shows the frequency synthesizer 350, where an output of a reference oscillator 302 (reference signal) is provided to a saw oscillator 304, a direct digital synthesizer (DDS) 306, and power splitter (PS) 308. An output of the PS 308 may be provided to a phase detector 310 of the PLL 340, which may also include a charge pump 312, a frequency divider 332, a loop filter 314, and an inverting amplifier (not shown). At the output of the loop filter 314, a VCO 316, a PS 318, an amplifier 320, a bandpass filter 322, and an output 324 may from an output path of the frequency synthesizer 350. The output 324 is the same output as output 536 in FIG. 5 and output 638 in FIG. 6B providing the frequency synthesizer signal 215 in FIG. 2.

Another output of the PS 308 may be provided to a multiplier 326, then to an amplifier 328, and to a mixer 330. The mixer 330 may also receive an output of the PS 318 and provide its output to a frequency divider 332 of the PLL 340. The VCO 316 may be a wide band VCO according to some examples. The reference oscillator 302 may be a stable signal source such as a temperature compensated crystal oscillator (TCXO), an ovenized crystal oscillator (OCXO), Rubidium oscillator, or similar ones. The PLL 340 may follow changes that occur in the VCO signal. The phase detector 310 may be used for detection and correction of errors in the VCO signal, while the charge pump 312 may convert the phase or frequency difference information into a voltage. The frequency divider 332 may divide its input frequency in a feedback loop for comparison with the frequency of the reference signal. The loop filter 314 may be a low-pass filter and used to force the VCO 316 to replicate and track the frequency and phase at the input when in lock.

In some examples, the VCO 316 may be a bank of electronic oscillators on an integrated circuit (IC) whose oscillation frequencies are controlled by a voltage input. Each VCO in the bank of VCOs may cover a frequency band within the overall wide band of the VCO 316. The applied input voltage (also referred to as tuning voltage, Vt) may determine the instantaneous oscillation frequency. In the frequency synthesizer 350, the VCO 316 may be used to generate a waveform whose pitch can be adjusted by the input signal. VCOs may be narrow band or wide band. A narrow band VCO may not be as sensitive to the tuning voltage compared to a wide band VCO. In a practical example, a wide band VCO for a frequency synthesizer with a frequency range of 7.5 GHz to 15 GHz may have a tuning voltage range of 0V to 3.3V.

It should be appreciated that frequency synthesizers that utilize a high divide ratio (e.g., N=100) in the frequency divider, which divides the RF input signal frequency to obtain a frequency close to the intermediate frequency, may have a high phase noise level. Thus, some frequency synthesizer designs may implement multiplication of the input signal frequency and mixing with a VCO signal such that a signal provided to the frequency divider has a frequency close to the IF (e.g., N=2) and thereby a substantially lower phase noise level. For example, a divide ratio of 1000 (10,000 MHz to 10 MHz), the output phase noise of frequency synthesizer may be degraded 60 dB from reference signal as 20 log N equation. On the other hand, a divide ratio of 2 (200 MHz to 100 MHz), the output phase noise of frequency synthesizer may be degraded only 6 dB from reference signal as 20 log N equation.

Accordingly, the DDS 306 may generate a first signal with a frequency which is a first multiple of the input frequency, and the first signal may be provided to the phase detector 310 of the PLL 340. The multiplier 326 may multiply the first signal's frequency to obtain a local signal making the local signal's frequency a second multiple of the input frequency. By using the multiple of the input frequency at the frequency divider 332, a divide ratio of the frequency divider may be reduced substantially, thereby reducing the phase noise when the PLL 340 is active.

Figure 4A:
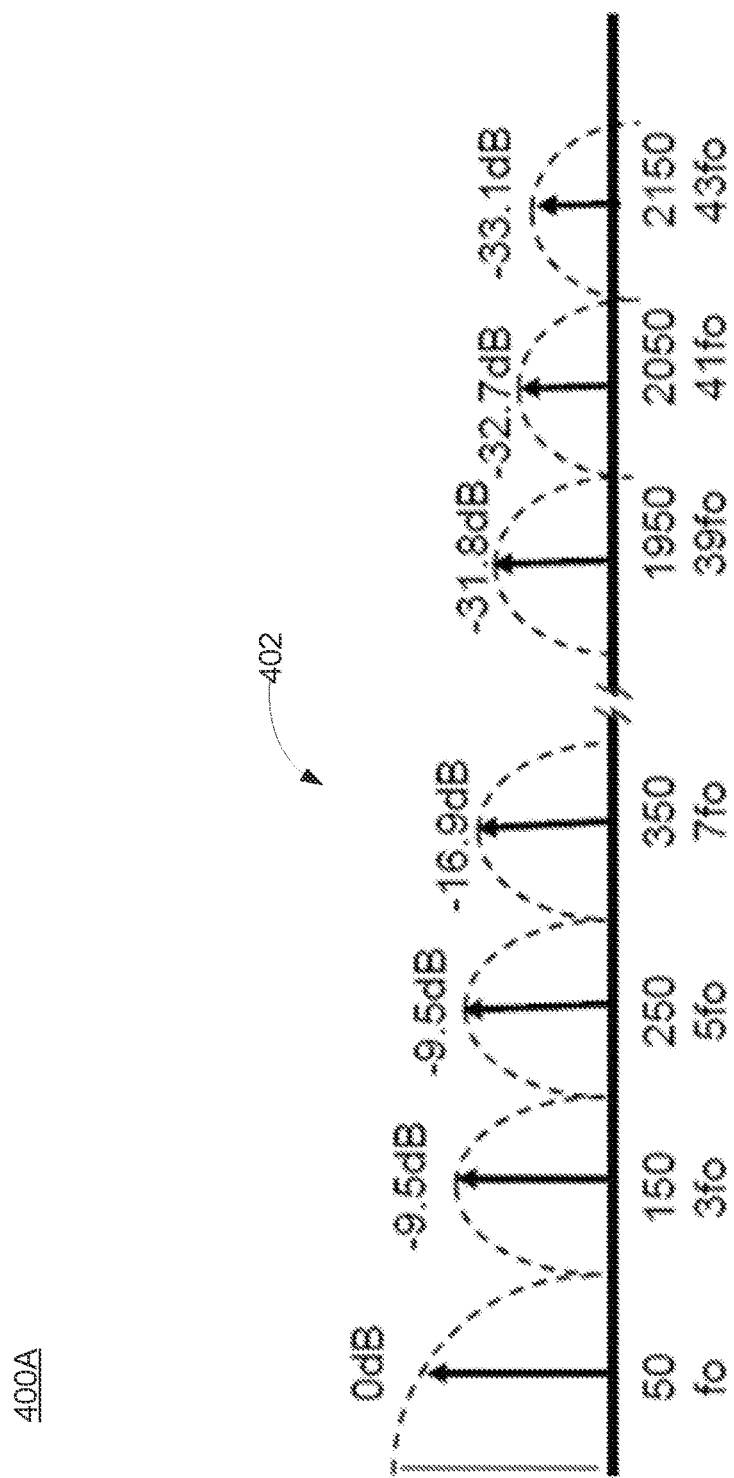
FIGS. 4A-4B illustrate integer boundary spurs (IBS) caused by poor isolation on a wideband synthesizer with integrated VCO that may be subject to IBS, according to an example.
Figure 4B:
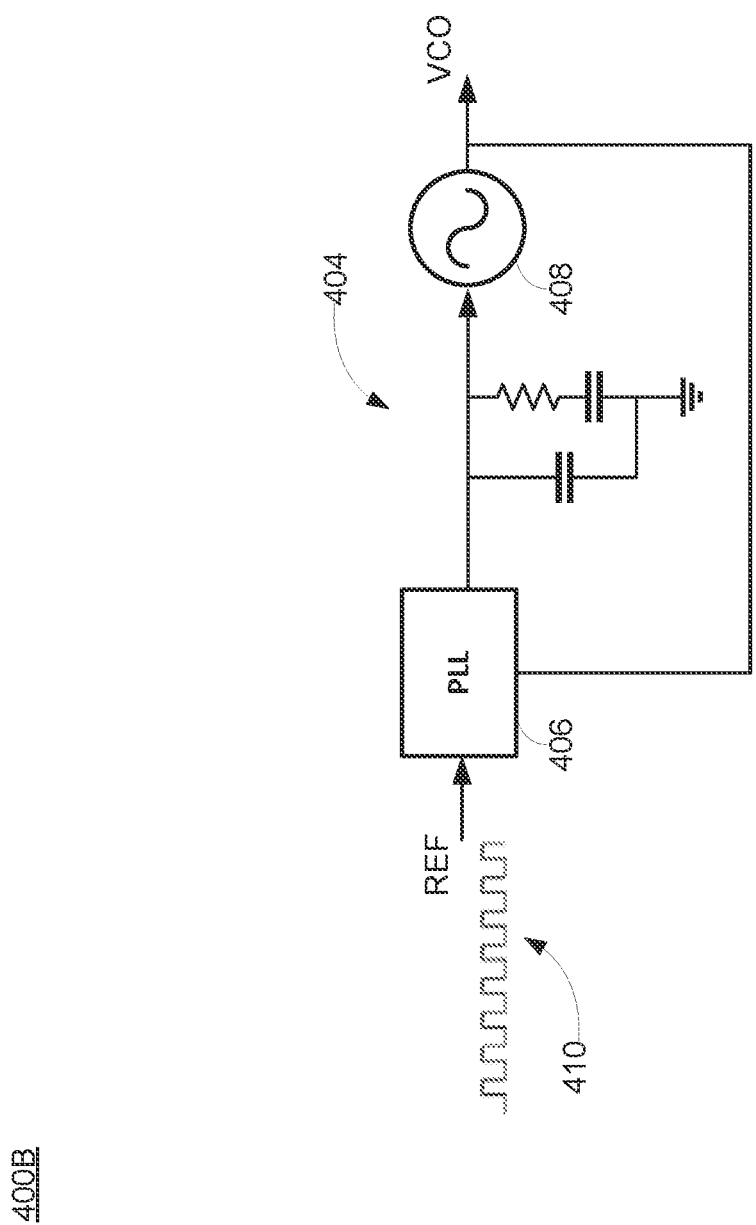

FIGS. 4A-4B illustrate integer boundary spurs (IBS) caused by poor isolation on a wideband synthesizer with integrated VCO that may be subject to IBS, according to an example.

A phase-locked loop (PLL) and voltage-controlled oscillator (VCO) output an RF signal at a certain frequency. In practice, there are unwanted spurious signals and phase noise at the output. Integer boundary spurs (IBS) appear when the PLL feedback loop fractional divide ratio is programmed to a value very close to an integer. These spurs occur because the harmonics of the phase detector frequency mix with the VCO (or its harmonics) and the resultant intermodulation frequency components fall within the loop bandwidth.

PLL and VCO combinations that are only capable of operating at integer multiples of the phase frequency detector reference frequency are known as integer-N PLLs. PLL-VCOs capable of much finer frequency steps are known as fractional-N PLLs. Fractional-N PLL-VCOs may offer more flexibility by modulating the feedback path in the PLL at the reference rate. While capable of much finer frequency steps than the phase detector reference frequency, fractional-N PLL-VCOs have spurious outputs called IBS. IBS occur at integer (1, 2, 3 . . . 20, 21 . . . ) multiples of the PLL's phase frequency detector's reference (or comparison) frequency (fo). For example, if fo=100 MHz, there may be integer boundary spurs at 100 MHz, 200 MHz, 300 MHz . . . 2000 MHz, 2100 MHz. In a system where the desired VCO output signal is 2001 MHz, then there may be an IBS at 2000 MHz (appearing at a 1 MHz offset from the desired signal). Due to effective sampling in the PLL system, this 1 MHz offset IBS may be aliased to both sides of the desired signal. Therefore, when the desired output is 2001 MHz, spurious signals may be present at 2000 MHz and 2002 MHz.

IBS are undesirable for two main reasons: (1) If they are at low frequency offsets from the carrier (the desired signal), then the IBS power may contribute to integrated phase noise.

(2) If they are at large frequency offsets from the carrier, then the IBS may modulate/demodulate adjacent channels to the desired channel and result in distortion in system. In some systems, high integer boundary spurs may render some output channels unusable. If a system has 1000 channels in a certain spectrum bandwidth, and 10% of the channels have spurious signals above a certain power level, those 100 channels may be unusable. Integer boundary spurs are strongest when the integer boundary falls within the PLL bandwidth from the desired output frequency. That is, if the output frequency is 2000.01 MHz and the loop bandwidth is 50 kHz, the IBS may be strongest. As the output frequency moves away from the integer boundary, the power of the IBS may reduce in a predictable and repeatable manner.

Diagram 400A shows phase detectors reference frequency (fo) and its multiples 402 with example levels of each channel, which may be generated by a PLL-VCO circuit 404 shown in simplified form in diagram 400B with PLL 406 and VCO 408. The circuit receives a reference signal 410 to generate the output of the synthesizer. To mitigate IBS, an isolation between the PLL and the VCO may need to be enhanced. In some examples, replacing an on-chip PLL with a low-divide ratio off-chip PLL and using it together with the on-chip VCO bank may improve the isolation, and thereby, the IBS. The IBS level may be typically managed with −75 dBc at user bandwidth.

Figure 5:
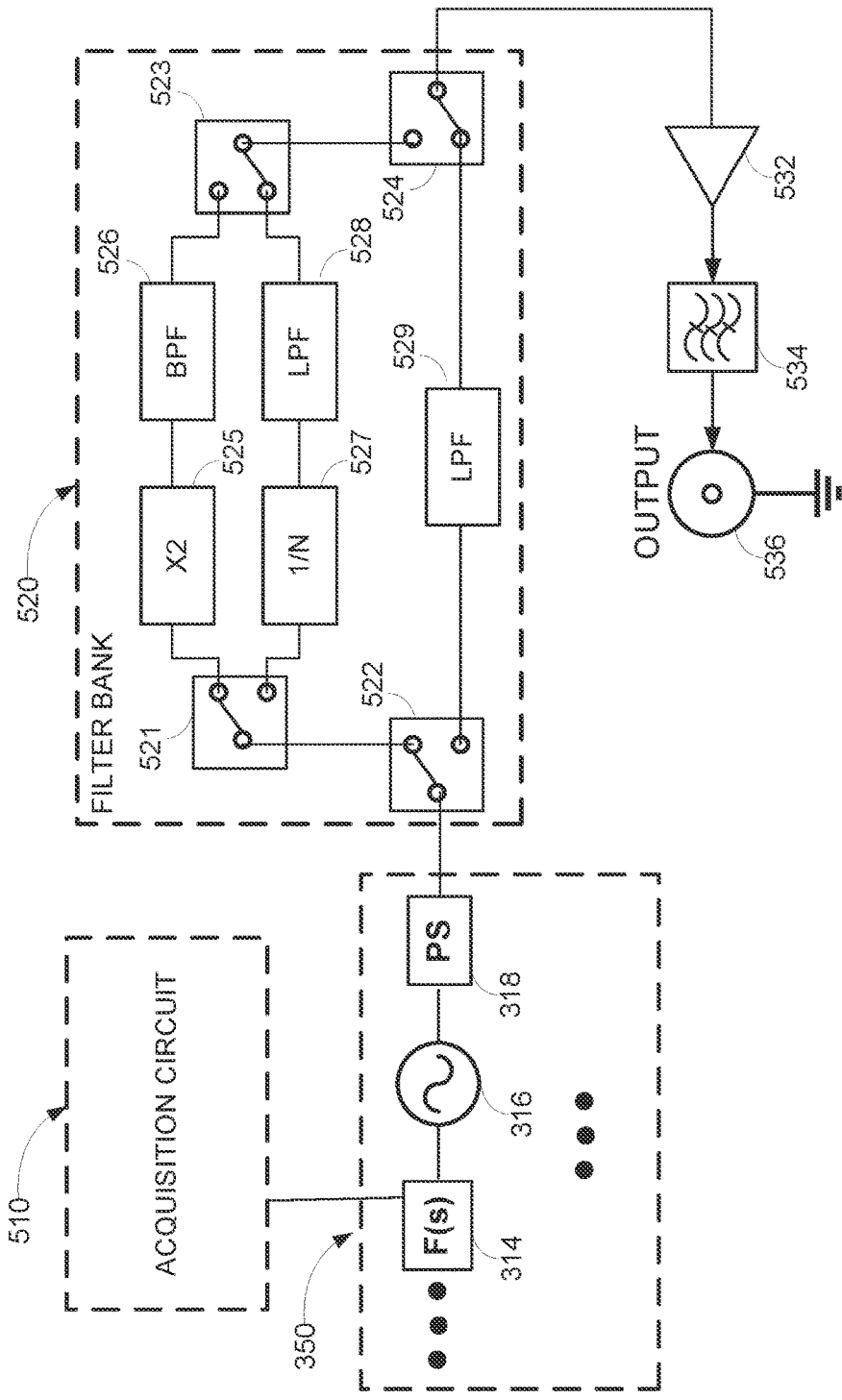
FIG. 5 illustrates a schematic diagram of a frequency synthesizer with a wide band VCO, acquisition circuit, and filter bank, according to an example.

FIG. 5 illustrates a schematic diagram 500 of a frequency synthesizer with a wide band VCO, acquisition circuit, and filter bank, according to an example. Diagram 500 includes the frequency synthesizer 350 of FIG. 3 with only select components (loop filter 314, VCO 316, and power splitter 318) shown. An acquisition circuit 510 may be coupled to the frequency synthesizer 350 through the loop filter 314 and an output of the power splitter 318 may be provided to a filter bank 520.

In some examples, the filter bank 520 may include a first switch (single-pole-double-throw "SPDT") 522 providing the output of the power splitter 318 to low pass filter 529 or second switch (SPDT) 521. The second switch (SPDT) 521 may provide the output of the power splitter 318 to either doubler 525 or divider 527. An output of the doubler 525 may be provided to an output amplifier circuit 532 through bandpass filter 526, third switch (SPDT) 523, and fourth switch (SPDT) 524. An output of the divider 527 may be provided to the output amplifier circuit 532 through low pass filter 528, the third switch (SPDT) 523, and the fourth switch (SPDT) 524. An output of the output amplifier circuit 532 may be provided to the frequency synthesizer output 536 through a bandpass filter 534. Thus, in this configuration, the frequency divider, doubler, and the filter bank are required to generate frequencies below and above the VCO band.

The acquisition circuit 510 may provide an output to control an adjustable resistor and another output to the VCO 316 (tuning voltage). The PLL may lock onto the output frequency based on a feedback input from the local frequency and, thus, have a low phase noise. If the PLL is out of range (fails to lock), the acquisition circuit 510 may be activated and lock onto the output frequency based on a phase comparison between the input frequency (frequency of the reference signal) and VCO frequency. The combination of the primary PLL and the acquisition circuit may provide low phase noise, fast tracking, wide band frequency synthesis. The configuration shown in diagram 500 may be a larger size, complicated circuit in addition to high sensitivity to tuning voltage, and relatively less controlled output flatness. The switches may be controlled by a processor implemented as a field programmable gate array (FPGA) or similar circuits, for example.

Figure 6A:
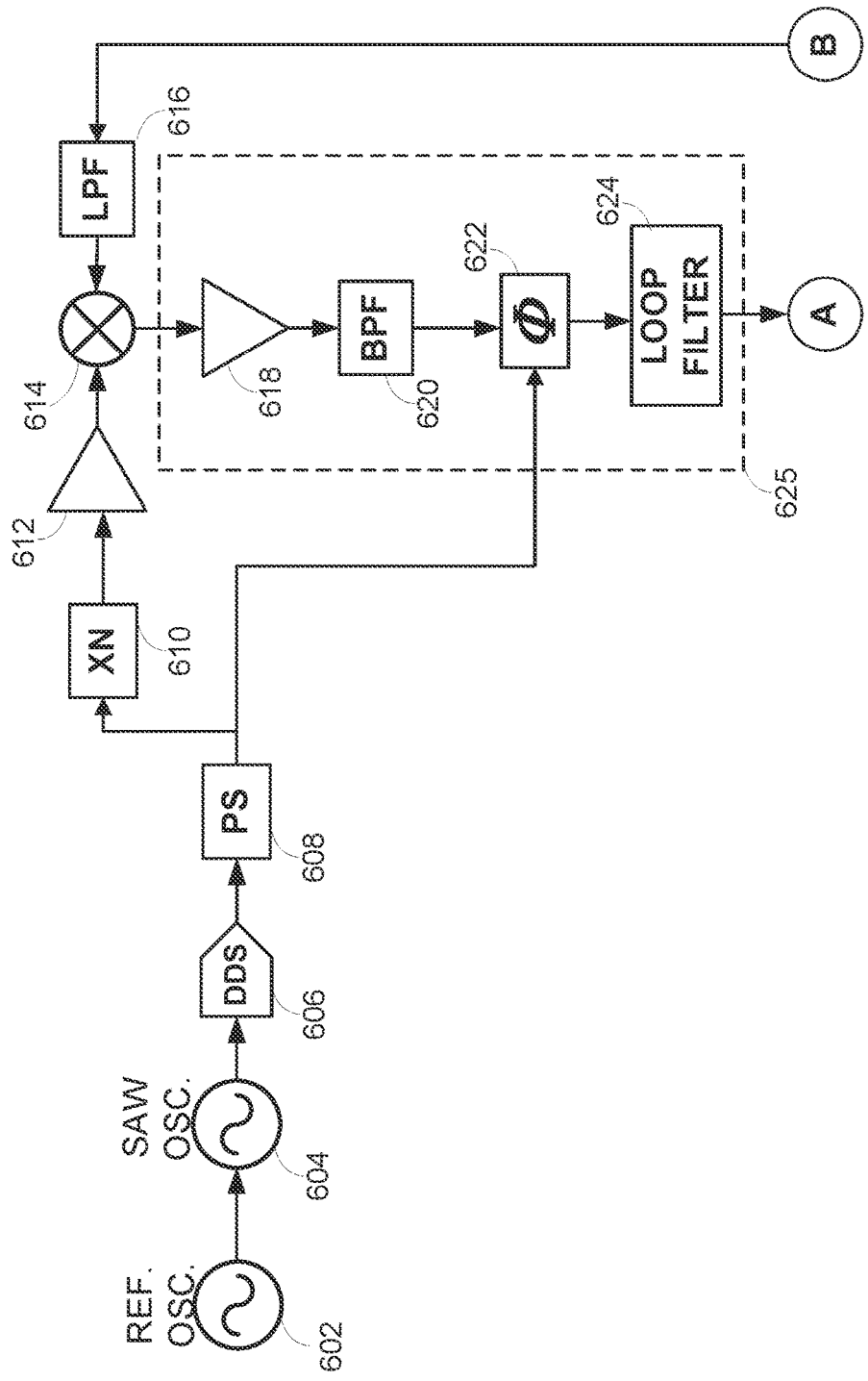
FIGS. 6A-6B illustrate a schematic diagram of a frequency synthesizer with a wide band VCO comprising a bank of on-chip VCO and a low divide ratio, off-chip PLL, according to an example.
Figure 6B:
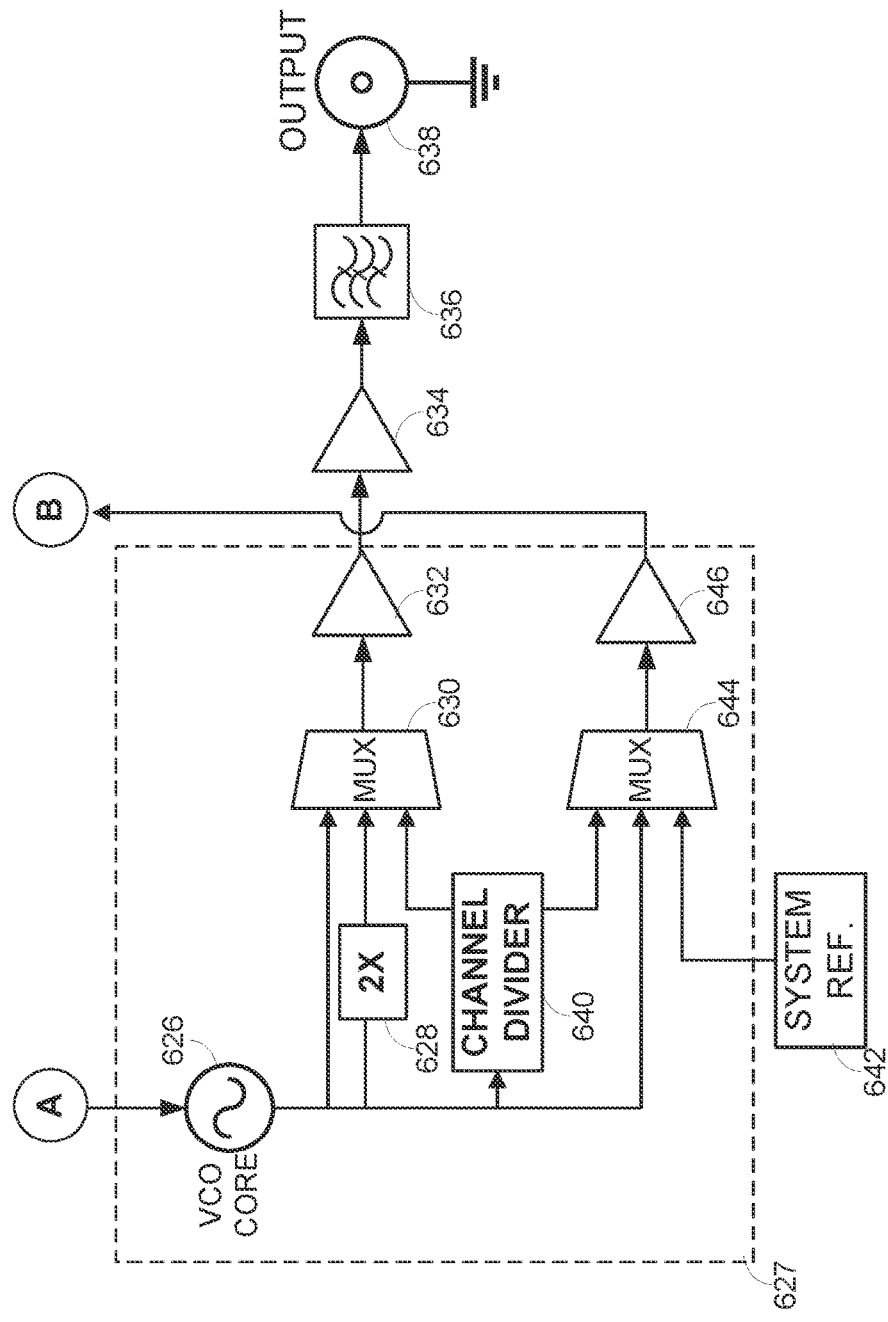

FIGS. 6A-6B illustrate a schematic diagram of a frequency synthesizer with a wide band VCO comprising a bank of on-chip VCOs and a low divide ratio, off-chip PLL, according to an example. Diagram 600A shows an output of a reference oscillator 602 (reference signal) being provided to a saw oscillator 604, a direct digital synthesizer (DDS) 606, and power splitter (PS) 608. An output of the PS 608 may be provided to a phase detector 622 of the PLL (e.g., on a PLL chip 625). Another output of the PS 608 may be provided to a multiplier 610, then to the amplifier 612, and to a mixer 614. The mixer 614 may also receive an output of VCO circuit (noted as "B" shown in more detail in FIG. 6B). An output of the mixer 614 may be provided through an amplifier 618 and a bandpass filter 620 to the phase detector 622. An output of the phase detector 622 may be provided through a loop filter circuit 624 to a VCO core (noted as "A" and shown in more detail in FIG. 6B).

Diagram 600B in FIG. 6B shows the VCO bank 626 receiving the output of the loop filter circuit 624 and providing various inputs to two multiplexers 630, 644. The multiplexer 630 may receive as a first input a direct output of the VCO bank 626, a second input through a doubler 628, and a third input through a channel divider 640. The multiplexer 644 may receive as first input a direct output of the VCO bank 626, a second input through the channel divider 640, and a third input from a system reference clock 642 (reference oscillator 602). An output of the multiplexer 644 may be provided through an amplifier 646 to the low pass filter 616 in diagram 600A. An output of the multiplexer 630 may be provided through amplifiers 632 and 634, and bandpass filter 636 to an output 638 of the frequency synthesizer. Thus, the multiplexer 644 may be used for feedback to the mixer eliminating a need for power splitters. The multiplexer 630 may provide the frequency synthesizer output covering all channels below and above the VCO band, in addition to the VCO band itself.

The multiplexer 630, the doubler 628, the channel divider 640, the amplifiers 632 and 634, and the bandpass filter 636 may be considered an output circuit of the frequency synthesizer. The multiplexer 644, the doubler 628, the channel divider 640, the amplifier 646, and the low pass filter 616 may be considered a feedback circuit of the frequency synthesizer providing the output of the VCO bank to the mixer 614. The VCO bank 626 and the associated output/feedback circuits may be implemented on a VCO chip 627. Thus, the PLL and the VCO may be implemented on separate chips providing enhanced isolation to reduce IBS.

In some examples, the on-chip VCO core may include a bank of VCOs, for example, seven VCOs. The frequency synthesizer may use all of a subset of the VCOs (e.g., 4 of 7). By using the low divide ratio PLL and the loop filter circuit, as well as the feedback loop from the output to the mixer, the acquisition circuit may be eliminated, higher frequency stability may be achieved, and sensitivity to the tuning voltage may be reduced. Furthermore, output flatness may be improved. Table 1 below shows an example implementation with seven VCOs in the core VCO bank, their frequency bands, and gains corresponding to a low end and a high end of each frequency band.

TABLE 1

| CORE | f1 | f2 | Kvco1 | Kvco2 |
|---|---|---|---|---|
| VCO1 | 7500 | 8600 | 73 | 114 |
| VCO2 | 8600 | 9800 | 61 | 121 |
| VCO3 | 9800 | 10800 | 98 | 132 |
| VCO4 | 10800 | 12000 | 106 | 141 |
| VCO5 | 12000 | 12900 | 170 | 215 |
| VCO6 | 12900 | 13900 | 172 | 216 |
| VCO7 | 13900 | 15000 | 182 | 239 |

To improve the VCO frequency stability, the VCO bank frequency range may be divided into the distinct frequency bands. Frequency calibration may be needed to determine the correct frequency band for a desired output frequency. The VCO may also be calibrated for amplitude to optimize phase noise. The calibration routines may be activated any time. The VCO core 626 takes the voltage from the loop filter circuit 624 and converts this into a frequency. The channel divider 640 may have an output of 10-7,500 MHz to provide frequencies below the VCO core's lower bound frequency. The channel divider 640 may include four segments, and the total division value may be equal to the multiplication of the four segments. The VCO doubler 628 may have an output of 15-20 GHz allowing the VCO frequency to be doubled.

Figure 7:
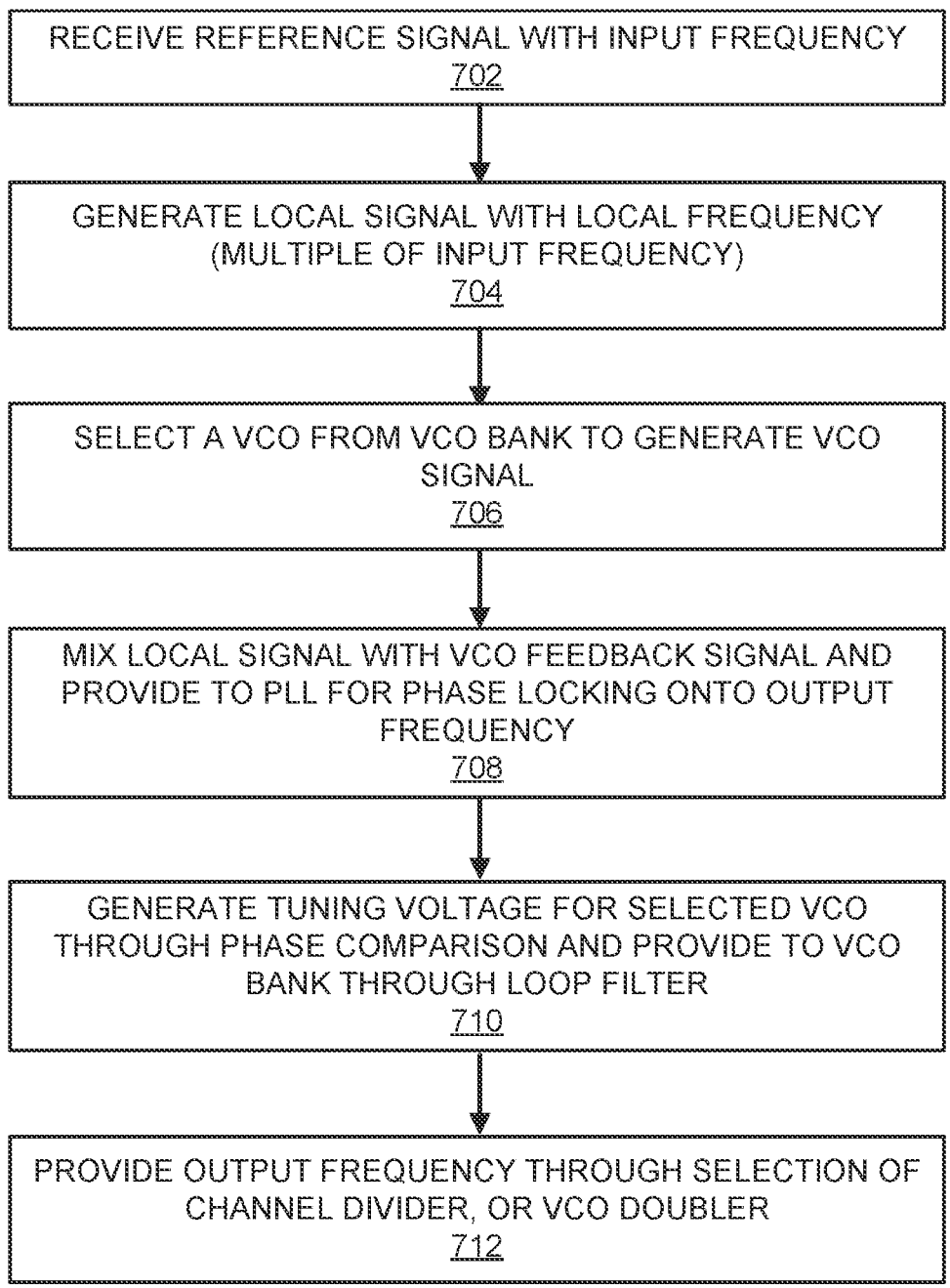
FIG. 7 illustrates a flow chart of a method for employing a frequency synthesizer with a bank of on-chip VCO and a low divide ratio, off-chip PLL, according to an example.

FIG. 7 illustrates a flow chart of a method for employing a frequency synthesizer with a bank of on-chip VCOs and a low divide ratio, off-chip PLL, according to an example. The method 700 is provided by way of example, as there may be a variety of ways to carry out the method described herein. Although the method 700 is primarily described as being performed by the circuits of FIGS. 6A-6B, the method 700 may be executed or otherwise performed by one or more processing components of another system or a combination of systems. Each block shown in FIG. 7 may further represent one or more processes, methods, or subroutines, and one or more of the blocks (e.g., the selection process) may include machine readable instructions stored on a non-transitory computer readable medium and executed by a processor or other type of processing circuit to perform one or more operations described herein.

At block 702, the frequency synthesizer may receive a reference signal (e.g., from reference oscillator 602) with an input frequency. At block 704, one or more components of the frequency synthesizer, such as the saw oscillator 604, the DDS 606, and/or the multiplier 610 may generate a local signal with a local frequency that is a multiple of the input frequency. At block 706, a VCO from the VCO bank may be selected to provide an output frequency. The VCO bank may include a number of VCOs with different frequency bands. The selection may be based on a desired output frequency and/or desired VCO gain of the frequency synthesizer.

At block 708, the multiple of the input frequency may be provided to a mixer along with a feedback signal from an output of the frequency synthesizer. The PLL may receive the mixer output, as well as the reference signal at a phase detector 622. At block 710, a tuning voltage may be generated for the VCO bank through phase comparison at the PLL and provided to the VCO bank 626 (the selected VCO) through a loop filter circuit 624. The output of the VCO bank may be multiplexed to the frequency synthesizer output at block 712 through a direct input, a channel divider input, and a VCO doubler input. Thus, the frequency synthesizer may provide frequency above and below the VCO bands.

Figure 8:
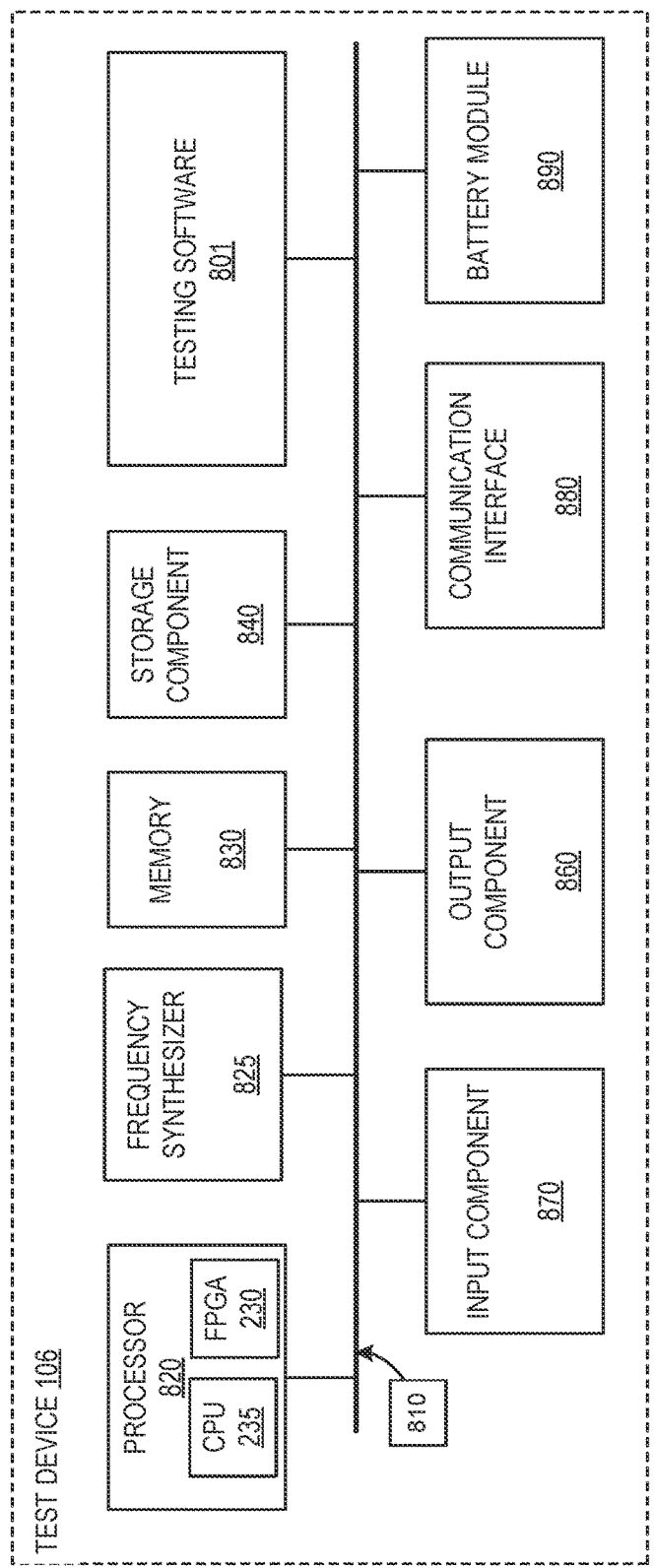
FIG. 8 illustrates a block diagram of the test device, according to an example.

FIG. 8 illustrates a block diagram 800 of the test device 106, according to an example. As shown in FIG. 8, the test device 106 may include the components of FIG. 2 and the components shown in FIG. 8. The test device 106 may include a bus 810, a processor 820, a memory 830, a storage component 840, an input component 870, an output component 860, a communication interface 880, and battery module 890.

Bus 810 includes a component that permits communication among the components of test device 106. Processor 820 may be implemented in hardware, firmware, or a combination of hardware and software. Processor 820 may include one or more of a central processing unit (CPU) 235, a graphics processing unit (GPU), an accelerated processing unit (APU), a microprocessor, a microcontroller, a digital signal processor (DSP), a field-programmable gate array (FPGA) 230, an application-specific integrated circuit (ASIC), or another type of processing component. In some examples, processor 820 may include one or more processors capable of being programmed to perform a function. Memory 830 may include one or more memories such as a random access memory (RAM), a read only memory (ROM), and/or another type of dynamic or static storage device (e.g., a flash memory, a magnetic memory, and/or an optical memory) that store information and/or instructions for use by processor 820.

Frequency synthesizer 825 may include low divide ratio PLL and a wide band VCO as described herein. The low divide ratio PLL may use a multiplied version of a reference signal to reduce a divide ratio in mixing the reference signal and a feedback signal from the VCO, and thereby obtain a low phase noise. The wide band frequency synthesizer may operate with frequencies in high RF range, for example, multiple GHz compared to narrow band devices. The PLL and the VCO may be implemented on separate chips (integrated circuits) or the PLL may be implemented as discrete circuits ("off-chip") on a printed circuit board (PCB) with the VCO on a chip on the same PCB to provide enhanced isolation between the PLL and the VCO.

Storage component 840 stores information and/or software related to the operation and use of test device 106. For example, storage component 840 may include a hard disk (e.g., a magnetic disk, solid state disk, etc.) and/or another type of non-transitory computer-readable medium.

Input component 870 may include a component that permits the test device 106 to receive information, such as via user input (e.g., a touch screen display, a keyboard, a keypad, a mouse, a button, a switch, and/or a microphone). Additionally, or alternatively, input component 870 may include a sensor for sensing information (e.g., a GPS component, an accelerometer, a gyroscope, and/or an actuator). Output component 860 includes a component that provides output information from the test device 106 (e.g., a display, a speaker, a user interface, and/or one or more light-emitting diodes (LEDs)). Output component 860 may include a display providing a GUI. Input component 870 and output component 860 may be combined into a single component, such as a touch responsive display, also known as a touchscreen.

Communication interface 880 may include a transceiver-like component (e.g., a transceiver and/or a separate receiver and transmitter) that enables test device 106 to communicate with other devices, such as via a wired connection, a wireless connection, or a combination of wired and wireless connections. Communication interface 880 may permit the test device 106 to receive information from another device and/or provide information to another device. For example, communication interface 880 may include an Ethernet interface, an optical interface, a coaxial interface, an infrared interface, an RF interface, a universal serial bus (USB) interface, a Wi-Fi interface, a cellular network interface, or the like.

Battery module 890 is connected along bus 810 to supply power to processor 820, memory 830, and internal components of the test device 106. Battery module 890 may supply power during field measurements by the test device 106. Battery module 890 may permit the test device 106 to be a portable.

The test device 106 may perform one or more processes described herein. The test device 106 may perform these processes by processor 820 executing software instructions (e.g., testing software 801) stored by a non-transitory computer-readable medium, such as memory 830 and/or storage component 840. A computer-readable medium is defined herein as a non-transitory memory device. A memory device includes memory space within a single physical storage device or memory space spread across multiple physical storage devices.

Software instructions may be read into memory 830 and/or storage component 840 from another computer-readable medium or from another device via communication interface 880. When executed, software instructions stored in memory 830 and/or storage component 840 may instruct processor 820 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The test device 106 may include components other than shown. For example, the test device 106 may include a spectrum analyzer and power meter for performing tests described above. The number and arrangement of components shown in FIG. 8 are provided as an example. In practice, the test device 106 may include additional components, fewer components, different components, or differently arranged components than those shown in FIG. 8. Additionally, or alternatively, a set of components (e.g., one or more components) of the test device 106 may perform one or more functions described as being performed by another set of components of the test device 106.

While specific circuit configurations such as the arrangements of a number of components are shown in conjunction with the test device including a frequency synthesizer with a bank of on-chip VCOs and a low divide ratio, off-chip PLL herein, the illustrated configurations are not intended to be limiting. A test device employing a frequency synthesizer with a bank of on-chip VCOs and a low divide ratio, off-chip PLL may be implemented with other configurations and component values using the principles described herein.

While examples described herein are directed to configurations as shown, it should be appreciated that any of the components described or mentioned herein may be altered, changed, replaced, or modified, in size, shape, and numbers, or material, depending on application or use case, and adjusted for desired resolution or optimal measurement results.

Moreover, single components may be provided as multiple components, and vice versa, to perform the functions and features described herein. It should be appreciated that the components of the system described herein may operate in partial or full capacity, or it may be removed entirely. It should also be appreciated that analytics and processing techniques described herein with respect to the optical measurements, for example, may also be performed partially or in full by other various components of the overall system.

It should be appreciated that data stores may also be provided to the apparatuses, systems, and methods described herein, and may include volatile and/or nonvolatile data storage that may store data and software or firmware including machine-readable instructions. The software or firmware may include subroutines or applications that perform the functions of the measurement system and/or run one or more application that utilize data from the measurement or other communicatively coupled system.

The various components, circuits, elements, components, and interfaces, may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

What has been described and illustrated herein are examples of the disclosure along with some variations. The terms, descriptions, and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

The invention claimed is:

1. A frequency synthesizer, comprising:
  a multiplier to:
    receive a first signal with a first frequency that is a multiple of an input frequency of a reference signal provided to the frequency synthesizer; and
    multiply the first frequency to obtain a local signal with a local frequency;
  a voltage-controlled oscillator (VCO) bank comprising a plurality of VCOs, wherein a VCO in the VCO bank is selected to provide a VCO signal with a VCO frequency based on a tuning voltage; and
  a phase-locked loop (PLL) comprising a phase detector, a charge pump, and a frequency divider, the PLL to:
    receive the first signal and a second signal with a second frequency, the second signal comprising the local signal and the VCO signal mixed together; and
    generate the tuning voltage to control the selected VCO based on a phase comparison of the first signal and the second signal, wherein
      the VCO bank is on-chip in an integrated circuit (IC) with an output circuit, and
      the PLL is off-chip external to the IC.

2. The frequency synthesizer of claim 1, wherein the output circuit comprises:
  a first multiplexer to receive a direct output of the selected VCO from the VCO bank;
  a doubler to provide a frequency doubled output of the selected VCO to the first multiplexer;
  a channel divider to provide a frequency divided output of the selected VCO to the first multiplexer; and
  at least one amplifier to amplify an output of the first multiplexer.

3. The frequency synthesizer of claim 2, wherein
  the doubler is employed to provide a frequency synthesizer output frequency above a VCO bank frequency range, and the channel divider is employed to provide a frequency synthesizer output frequency below the VCO bank frequency range.

4. The frequency synthesizer of claim 2, wherein the VCO signal is provided to a mixer to mix the VCO signal and the local signal together by a feedback circuit comprising:
a second multiplexer to receive the direct output of the selected VCO from the VCO bank, the frequency divided output of the selected VCO, and the first signal; and
at least one second amplifier to amplify an output of the second multiplexer.

5. The frequency synthesizer of claim 1, wherein
each VCO in the VCO bank is to provide the VCO signal in a distinct frequency band, and
the selected VCO is selected based on an output frequency of the frequency synthesizer.

6. The frequency synthesizer of claim 1, wherein the PLL further comprises:
a loop filter circuit comprising an amplifier circuit and a low-pass filter, wherein:
an output of the amplifier circuit is provided to the low-pass filter, and
an output of the low-pass filter is provided to the VCO bank.

7. The frequency synthesizer of claim 1, further comprising:
a saw oscillator to receive the reference signal; and
a direct digital synthesizer (DDS) to receive an output of the saw oscillator and generate the second signal.

8. The frequency synthesizer of claim 7, wherein:
the phase detector is to receive the first signal, and
the frequency divider is to receive the second signal.

9. A method for wide band frequency synthesis, comprising:
receiving a reference signal with an input frequency at an input of a frequency synthesizer;
generating a first signal with a first frequency that is a first multiple of the input frequency;
generating a local signal with a local frequency, wherein the local frequency is a second multiple of the first frequency;
selecting a voltage-controlled oscillator (VCO) from a VCO bank to provide a VCO signal with a VCO frequency based on a tuning voltage;
generating the VCO signal at the selected VCO;
generating a second signal comprising the local signal and the VCO signal mixed together;
providing the first signal and the second signal to a phase-locked loop (PLL);
performing a phase comparison at the PLL between the first signal and the second signal; and
generating the tuning voltage based, at least in part, on the phase comparison, wherein
the VCO bank is on-chip in an integrated circuit (IC) with an output circuitry, and
the PLL is off-chip external to the IC.

10. The method of claim 9, further comprising:
providing the VCO signal, a frequency doubled version of the VCO signal, and a frequency divided version of the VCO signal to a first multiplexer;
amplifying and bandpass filtering an output of the first multiplexer; and
providing the amplified and bandpass filtered output of the first multiplexer as an output of the frequency synthesizer.

11. The method of claim 10, further comprising:
providing the VCO signal, the frequency divided version of the VCO signal, and the first signal to a second multiplexer;
amplifying and low pass filtering an output of the second multiplexer; and
providing the amplified and low pass filtered output of the second multiplexer as a feedback signal to a mixer mixing the local signal and the VCO signal together.

12. The method of claim 9, wherein
selecting the VCO from the VCO bank comprises selecting the VCO based on an output frequency of the frequency synthesizer, and
each VCO in the VCO bank is to provide a signal in a distinct frequency band.

13. The method of claim 9, wherein generating the local signal with the local frequency comprises:
generating the first signal at a direct digital synthesizer (DDS);
providing the first signal to a phase detector o the PLL; and
multiplying the first signal at a multiplier.

14. The method of claim 9, wherein the PLL comprises an inverting amplifier circuit with an adjustable resistor.

15. The method of claim 9, further comprising:
providing the second signal to a frequency divider of the PLL.

16. A frequency synthesizer, comprising:
a mixer to mix a multiple of an input signal of the frequency synthesizer and a voltage-controlled oscillator (VCO) feedback signal;
an on-chip VCO bank implemented in an integrated circuit (IC) comprising a plurality of VCOs, wherein a VCO in the VCO bank is selected to provide a VCO signal with a VCO frequency based on a tuning voltage;
an off-chip phase-locked loop (PLL) external to the IC, the PLL to:
receive an output of the mixer and the input signal; and
generate the tuning voltage based on a phase comparison of the output of the mixer and the input signal; and
an output circuit comprising:
a first multiplexer to receive a direct output of the selected VCO from the VCO bank;
a doubler to provide a frequency doubled output of the selected VCO to the first multiplexer;
a channel divider to provide a frequency divided output of the selected VCO to the first multiplexer; and
at least one amplifier to amplify an output of the first multiplexer.

17. The frequency synthesizer of claim 16, wherein
the doubler is employed to provide a frequency synthesizer output frequency above a VCO bank frequency range, and
the channel divider is employed to provide a frequency synthesizer output frequency below the VCO bank frequency range.

18. The frequency synthesizer of claim 17, further comprising a feedback circuit to provide the VCO feedback signal to the mixer, the feedback circuit comprising:
a second multiplexer to receive the direct output of the selected VCO from the VCO bank, the frequency divided output of the selected VCO, and the input signal; and
at least one amplifier to amplify an output of the second multiplexer.

19. The frequency synthesizer of claim 16, wherein
each VCO in the VCO bank is to provide the VCO signal in a distinct frequency band, and
the selected VCO is selected based on an output frequency of the frequency synthesizer.

20. The frequency synthesizer of claim 16, wherein the PLL comprises a loop filter circuit to receive the input signal and the output of the mixer.

\* \* \* \* \*